United States Patent
Zweering

(10) Patent No.: US 10,168,619 B1
(45) Date of Patent: Jan. 1, 2019

(54) OPTICAL DEVICE FOR A LITHOGRAPHY APPARATUS, AND LITHOGRAPHY APPARATUS

(71) Applicant: Carl Zeiss SMT GmbH, Oberkochen (DE)

(72) Inventor: Ralf Zweering, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/124,738

(22) Filed: Sep. 7, 2018

Related U.S. Application Data

(63) Continuation of application No. PCT/EP2017/053289, filed on Feb. 14, 2017.

(30) Foreign Application Priority Data

Mar. 14, 2016 (DE) .................. 10 2016 204 143

(51) Int. Cl.
  *G03B 27/54* (2006.01)
  *G03F 7/20* (2006.01)
(52) U.S. Cl.
  CPC .......... *G03F 7/70033* (2013.01); *G03F 7/702* (2013.01); *G03F 7/70166* (2013.01); *G03F 7/70758* (2013.01); *G03F 7/70833* (2013.01)
(58) Field of Classification Search
  CPC ............. G03F 7/70833; G03F 7/70825; G03F 7/70033; G03F 7/70758; G03F 7/70166; G03F 7/702; G02B 7/1827
  See application file for complete search history.

(56) References Cited

U.S. PATENT DOCUMENTS

| 2003/0010902 A1 | 1/2003 | Hof et al. |
| 2011/0194091 A1* | 8/2011 | Kwan ................. G03F 7/70833 |
| | | 355/67 |
| 2012/0154774 A1 | 6/2012 | Van Der Wijst et al. |
| 2013/0314681 A1 | 11/2013 | Erath et al. |
| 2014/0021324 A1 | 1/2014 | Schumacher et al. |

FOREIGN PATENT DOCUMENTS

| DE | 101 34 387 A1 | 1/2003 |
| DE | 10 2011 004 607 A1 | 1/2012 |
| DE | 10 2011 088 735 A1 | 6/2012 |
| DE | 10 2012 212 503 A1 | 1/2014 |
| JP | 2005-166996 | 6/2005 |

OTHER PUBLICATIONS

Translation of International Search Report for corresponding PCT Application No. PCT/EP2017/053289, dated May 30, 2017.

* cited by examiner

*Primary Examiner* — Peter B Kim
(74) *Attorney, Agent, or Firm* — Fish & Richardson P.C.

(57) ABSTRACT

The disclosure relates to an optical device for a lithography system, including an optical element, a supporting frame supporting the optical element, a sensor frame mechanically decoupled from the supporting frame, wherein a gap is provided between the supporting frame and the sensor frame, and a sensor assembly designed to determine a width of the gap in a contactless manner. The sensor assembly has a contact element and a contact surface. The contact element is designed to contact the contact surface to limit relative motion of the supporting frame relative to the sensor frame.

20 Claims, 9 Drawing Sheets

OPTICAL DEVICE FOR A LITHOGRAPHY APPARATUS, AND LITHOGRAPHY APPARATUS

CROSS-REFERENCE TO RELATED APPLICATIONS

The present application is a continuation of, and claims benefit under 35 USC 120 to, international application PCT/EP2017/053289, filed Feb. 14, 2017, which claims benefit under 35 USC 119 of German Application No. 10 2016 204 143.6, filed Mar. 14, 2016. The entire disclosure of these applications are incorporated by reference herein.

FIELD

The disclosure relates to an optical device for a lithography apparatus, and to a lithography apparatus including such an optical device.

BACKGROUND

Microlithography is used for producing microstructured components, for example integrated circuits. The microlithographic process is performed using a lithography apparatus, which has an illumination system and a projection system. The image of a mask (reticle) illuminated via the illumination system is in this case projected via the projection system onto a substrate (for example a silicon wafer) which is coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses that use light with a wavelength in the range of 0.1 nm to 30 nm, in particular 13.5 nm. In the case of such EUV lithography apparatuses, because of the high absorption of light of this wavelength by most materials, reflective optical units, that is to say mirrors, have to be used instead of—as previously—refractive optical units, that is to say lens elements.

The mirrors may for example be fixed to a supporting frame (force frame) and be designed as at least partially manipulable, in order to allow a movement of a respective mirror in up to six degrees of freedom, and consequently a highly accurate positioning of the mirrors in relation to one another, in particular in the picometers range. This allows changes in the optical properties that occur for instance during the operation of the lithography apparatus, for example as a result of thermal influences, to be compensated for.

For mounting the mirrors on the supporting frame, usually weight force compensation units on the basis of permanent magnets (magnetic gravity compensators) are used, as described for example in DE 10 2011 088 735 A1. The compensation force generated by such a weight force compensation unit acts counter to the weight force of the mirror, and corresponds substantially to it in terms of its absolute value.

By contrast, the movement of a respective mirror—in particular also in the vertical direction—is actively controlled by way of so-called Lorentz actuators. Such a Lorentz actuator respectively includes an energizable coil and, at a distance from it, a permanent magnet. These together generate an adjustable magnetic force for controlling the movement of the respective mirror. By way of example, such Lorentz actuators are described in DE 10 2011 004 607 A1.

Sensors provided on a sensor frame can be provided for determining the position of the mirrors. With the aid of the sensors, the positioning of the mirrors can be checked and, if appropriate, corrected. The supporting frame and the sensor frame are mechanically decoupled from one another. A mechanical decoupling should be understood to mean that no forces, vibrations and/or oscillations are transmitted from the sensor frame to the supporting frame, or vice versa. This can be achieved for example via a very soft and/or resilient mounting of the sensor frame.

In order to prevent damage to the supporting frame and/or the sensor frame during tilting or during transport of the lithography apparatus, so-called end stops can be provided, which restrict a relative movement of the supporting frame with respect to the sensor frame and form a defined stop. Before the lithography apparatus is started up, a width of a gap provided at the end stops is checked with the aid of a feeler gauge. In this case, end stops that are not accessible and/or not visible can be checked only with difficulty or not at all. As an alternative to the use of a feeler gauge, the measurement of the width of the gap at the end stops can be carried out in a non-contact manner with the aid of an air pressure measuring method in which a nozzle through which air is guided is provided in the respective end stop. By determining the air pressure, it is possible to draw conclusions about the width of the gap.

If the gap at the end stops is too small, a mechanical short circuit can occur, that is to say touching contact between the supporting frame and the sensor frame. Such a mechanical short circuit can considerably disturb the dynamic behavior of a projection lens of the lithography apparatus. The correct determination of the width of the gap before the lithography apparatus is started up is therefore important for the reliable functionality of the lithography apparatus.

SUMMARY

The disclosure seeks to provide an improved optical device for a lithography apparatus and also an improved lithography apparatus.

Accordingly, an optical device for a lithography apparatus is provided. The optical device includes an optical element, a supporting frame, which supports the optical element, a sensor frame, which is mechanically decoupled from the supporting frame, wherein a gap is provided between the supporting frame and the sensor frame, and a sensor arrangement, which is configured to determine a width of the gap in a non-contact manner. In this case, the sensor arrangement has a contact element and a contact surface, wherein the contact element is configured to contact the contact surface in order to limit a relative movement of the supporting frame relative to the sensor frame.

Advantageously, the contact element and the contact surface thus fulfill two functions: Firstly, they form part of a sensor arrangement for determining the width of the gap in a non-contact manner. Secondly, they limit the relative movement of the supporting frame and sensor frame with respect to one another, that is to say that the contact element functions as an end stop. This functional integration means a saving of structural space and/or component parts.

The optical device can be a projection system of the lithography apparatus. The projection system can also be referred to as a projection lens. The supporting frame can also be referred to as a force frame. The optical device can include a multiplicity of optical elements, for example lens elements and mirrors. The fact that the supporting frame supports the optical element should be understood to mean that the optical element is coupled to the supporting frame with the aid of the above-described weight force compensation units and Lorentz actuators. In particular, the optical element is manipulable, that is to say adjustable and/or deformable, for positioning or position correction of same. The supporting frame and/or the sensor frame can be produced from a ceramic material or a metallic material. In particular, the supporting frame can be produced from a non-oxide ceramic, for example from a silicon carbide. Preferably, at least the supporting frame is produced from an electrically conductive material. In particular, a multiplicity of sensors can be provided on the sensor frame, the sensors being configured to detect the positioning of the optical element. With the aid of the position of the optical element as determined by the sensors, the alignment of the optical element can be corrected with the aid of actuators, in particular Lorentz actuators, coupled to the supporting frame. The width of the gap is preferably 100 to 300 μm.

A mechanical decoupling of the supporting frame from the sensor frame should preferably be understood to mean that no or at least negligible oscillations, forces and/or vibrations are transmitted from the supporting frame to the sensor frame, and vice versa. This can be achieved by the sensor frame being mounted with the aid of a soft mounting or actuator system. By way of example, the sensor frame can be mounted with the aid of very soft spring elements. Preferably, the supporting frame is grounded.

In order to limit the relative movement of the supporting frame in relation to the sensor frame, the contact element can contact the contact surface areally or in a punctiform manner. Preferably, the contact element is formed from an aluminum-bronze alloy, whereby it is possible to achieve a high compressive strength in conjunction with low abrasion. In particular, it is crucial for the functionality of the optical device that no particles, such as metal abrasion, for example, arise. As a result, the functionality of the optical device is not jeopardized even upon contact between the contact element and the contact surface. The contact surface can be an end side of the supporting frame or of the sensor frame which is provided on same and which then, if it is provided on the supporting frame, faces the sensor frame, and vice versa. The contact element and the contact surface are in each case preferably electrically conductive. The width of the gap can be defined as a distance between the contact surface and an end side of the contact element.

In accordance with a further embodiment, the contact element, for the transport securing of the optical device, is displaceable in relation to the sensor frame or the supporting frame in order to brace the supporting frame with the sensor frame. Preferably, a multiplicity of such contact elements and corresponding contact surfaces are provided. In order to brace the supporting frame with the sensor frame, it is possible to move the contact elements against the corresponding contact surfaces, whereby it is possible to obtain a bracing of the supporting frame and the sensor frame. A transport securing can be achieved as a result. In order to start up the lithography apparatus, the contact elements are moved away from the contact surfaces and the respective width of the gap is determined and, if appropriate, set.

In accordance with a further embodiment, the optical device furthermore includes a receptacle element fitted to the sensor frame or to the supporting frame, the contact element being received in the receptacle element. The receptacle element can be produced from a steel material, for example. The receptacle element preferably has a tubular base section, in which the contact element is able to be received. In particular, the contact element includes a contact section for contacting the contact surface and a shaft section, which is received in the base section. Furthermore, the receptacle element preferably includes a sheet-type flange section, which is materially integrally connected to the base section. The flange section can be fixedly connected to the supporting frame or the sensor frame with the aid of fixing elements, such as fixing screws, for example. An insulation element, such as a ceramic sheet, for example, can be provided between the flange section and the sensor frame or the flange section and the supporting frame. The electrical insulation of the receptacle element and the contact element from the sensor frame or the contact frame can be achieved as a result.

In accordance with a further embodiment, between the receptacle element and the sensor frame or between the receptacle element and the supporting frame circumferentially around the receptacle element provision is made of a gap for electrically insulating the receptacle element and the contact element from the sensor frame or the supporting frame. The contact element is preferably electrically conductively connected to the receptacle element. The gap preferably extends completely around the base section of the receptacle element. The gap can have a width of 50 μm, for example.

In accordance with a further embodiment, the contact element is displaceable relative to the receptacle element along a center axis thereof. Preferably, the contact element is configured rotationally symmetrically with respect to a center axis of same. The receptacle element is also configured rotationally symmetrically with respect to its center axis. Preferably, the center axis of the contact element and the center axis of the receptacle element are arranged collinearly with respect to one another. The contact element preferably has the cylindrical contact section and also the pin- or rod-shaped base section. Preferably, an external thread is provided on the outer side of the base section, the external thread emerging in a positively locking manner into a corresponding internal thread provided on the inner side of the base section of the receptacle element. The threads can be for example in each case a fine thread, in particular an M12×0.5 thread. As a result, the contact element is displaceable by a rotation of same relative to the receptacle element. For securing the position of the contact element relative to the receptacle element, the contact element can be secured with the aid of a securing nut. For adjusting the contact element, the securing nut can be released, the contact element can subsequently be rotated for the purpose of setting the width of the gap between the contact surface and the contact element, as a result of which the latter is displaced into or out of the receptacle element. Subsequently, after the positioning of the contact element, the latter can be secured in the desired position again with the aid of the securing nut. Alternatively, provision can also be made of other setting units, such as a piezoactuator, for example, for displacing the contact element relative to the receptacle element.

In accordance with a further embodiment, the optical device furthermore includes a mating contact element, which has the contact surface. The mating contact element can be in the form of a plate or sheet, for example. The mating contact element can be fixedly connected to the supporting frame or to the sensor frame. By way of example, the mating contact element can be screwed to the supporting frame or to the sensor frame. The mating contact element can have a circular geometry. Preferably, the mating contact element is grounded.

In accordance with a further embodiment, the mating contact element is electrically conductively connected to the sensor frame or the supporting frame. Preferably, the frame on which the mating contact element is provided is grounded. Alternatively, the mating contact element can be electrically insulated from the sensor frame or the supporting frame, wherein the mating contact element in this case is itself grounded.

In accordance with a further embodiment, the mating contact element has a spring section configured to deform spring-elastically upon contact with the contact element. Preferably, the mating contact element is in the form of a pot and has a tubular base section closed off by the spring section at the end side. Situated opposite the spring section, a fixing section is provided on the base section, the fixing section being fixedly connected either to the supporting frame or to the sensor frame. The base section can furthermore have one or more holes configured to ventilate an interior of the mating contact element. As a result, damage or deformation of the mating contact element is reliably prevented in the event of a vacuum being applied to the optical device. The mating contact element is preferably produced from a titanium-aluminum alloy.

In accordance with a further embodiment, the supporting frame has one from the contact element and the contact surface and the sensor frame has the other from the contact element and the contact surface. In other words, either the contact surface is provided on the sensor frame and the contact element is provided on the supporting frame or the contact surface is provided on the supporting frame and the contact element is provided on the sensor frame. This results in a flexible construction of the optical device. As a result, the optical device is usable in diverse ways.

In accordance with a further embodiment, the sensor arrangement is configured to determine a width of the gap capacitively, optically or inductively. By virtue of the fact that the width of the gap is measured capacitively, optically or inductively, it is possible to dispense with touch-based measuring methods, for example with the aid of a feeler gauge, and with technically complex measuring methods, such as the air pressure measuring method described above. The width of the gap can be determined reliably even if the gap is not accessible and/or not visible. As a result, the functionality of the lithography apparatus always remains ensured.

Preferably, in the case of the sensor arrangement, in particular two surfaces, of which respectively one is provided on the supporting frame and the other is provided on the sensor frame, form the plates of a capacitor, in particular of a plate capacitor. In the event of a relative movement of the supporting frame with respect to the sensor frame, or vice versa, the electrical capacitance of the capacitor changes. That is to say that in the event of the supporting frame and the sensor frame moving toward one another or moving away from one another, the width of the gap changes and thus the electrically measurable capacitance of the capacitor changes. Due to the change in capacitance, it is possible to determine an alteration of the width of the gap. In order to measure the width, a characteristic curve of the capacitor is linearized in analog or digital fashion. The sensor arrangement thus forms a capacitive distance sensor.

In accordance with a further embodiment, the contact element and the contact surface jointly form a capacitor of the sensor arrangement for capacitively determining the width of the gap. A capacitor is a passive electrical component having the ability, in a DC circuit, to store electrical charges and the energy associated therewith statically in an electric field. The stored charge per voltage is referred to as electrical capacitance and is measured in farads as the unit. In an AC circuit, a capacitor acts as an impedance having a frequency-dependent impedance value. The capacitance of the capacitor can be altered via the contact element and the contact surface being displaced toward one another or being displaced away from one another. Due to the change in capacitance, it is possible to draw a conclusion about the width of the gap between the contact element and the contact surface.

In accordance with a further embodiment, the sensor arrangement has a guard ring capacitor for field shielding, the guard ring capacitor being provided at the contact element. The guard ring capacitor can also be referred to as a guard ring. With the aid of the guard ring capacitor, it is possible to achieve a homogeneous electric field having approximately straight field lines between the contact element and the contact surface. As a result, the measurement accuracy can be increased. The width of the gap can thus be determined with an accuracy of 10 μm. The guard ring capacitor can be ring-shaped and be fitted to the contact section of the contact element.

In accordance with a further embodiment, the sensor arrangement, for optically determining the width of the gap, has a confocal sensor, wherein preferably the confocal sensor or a part thereof is arranged in an opening in the contact element. A confocal sensor means such a sensor in which the distance measurement is based on the confocal principle, that is to say that use is made of two beam paths having a common focal point.

In accordance with a further embodiment, an eddy current for inductively determining the width of the gap is generatable in the contact element and/or in the contact surface. An eddy current sensor of this type is advantageously insensitive to media such as dust in the measurement gap.

In accordance with a further embodiment, on the contact element provision is made of an electrical connector for electrically connecting same to an evaluation unit of the sensor arrangement. A cable can be provided between the evaluation unit and the contact element. The cable has a plug that is able to be plugged into the electrical connector in a releasable manner. Furthermore, an electrical cable can be provided on the contact element, which electrical cable, if the contact element is difficult to access spatially, is led away from the latter and fitted to a location of the optical device which has good accessibility. The evaluation unit can then be connected to the cable for the purpose of determining the width of the gap. The evaluation unit can be successively attached to all contact elements of the optical device. A plurality of evaluation units can also be provided. The evaluation units are removed again from the optical device after the width of the gap has been set.

In accordance with a further embodiment, the contact element has a spherically curved contact section. A punctiform contact between the contact element and the contact surface can be achieved as a result. Alternatively, the contact section can be formed in cylindrical fashion with a circular cross-sectional area and a planar end side. An areal contact between the contact element and the contact surface can be achieved as a result.

Furthermore, a lithography apparatus, in particular an EUV or a DUV lithography apparatus, including at least one device as described above is provided. EUV stands for "extreme ultraviolet" and refers to a wavelength of the working light of between 0.1 and 30 nm. DUV stands for "deep ultraviolet" and refers to a wavelength of the working light of between 30 and 250 nm.

The embodiments and features described for the proposed optical device are correspondingly applicable to the proposed lithography apparatus.

Further possible implementations of the disclosure also include not explicitly mentioned combinations of features or embodiments that are described above or below with respect to the exemplary embodiments. In this case, the person skilled in the art will also add individual aspects as improvements or supplementations to the respective basic form of the disclosure.

BRIEF DESCRIPTION OF THE DRAWINGS

Further advantageous configurations and aspects of the disclosure are the subject matter of the dependent claims and also of the exemplary embodiments of the disclosure described below. In the text that follows, the disclosure is explained in more detail on the basis of preferred embodiments with reference to the accompanying figures.

DETAILED DESCRIPTION

In the figures, identical or functionally identical elements have been provided with the same reference signs, unless indicated to the contrary. Insofar as a reference sign has a plurality of reference lines in the present case, this means that the corresponding element is present multiply. Reference sign lines pointing to concealed details are illustrated in a dashed manner. It should also be noted that the illustrations in the figures are not necessarily true to scale.

Figure 1A:
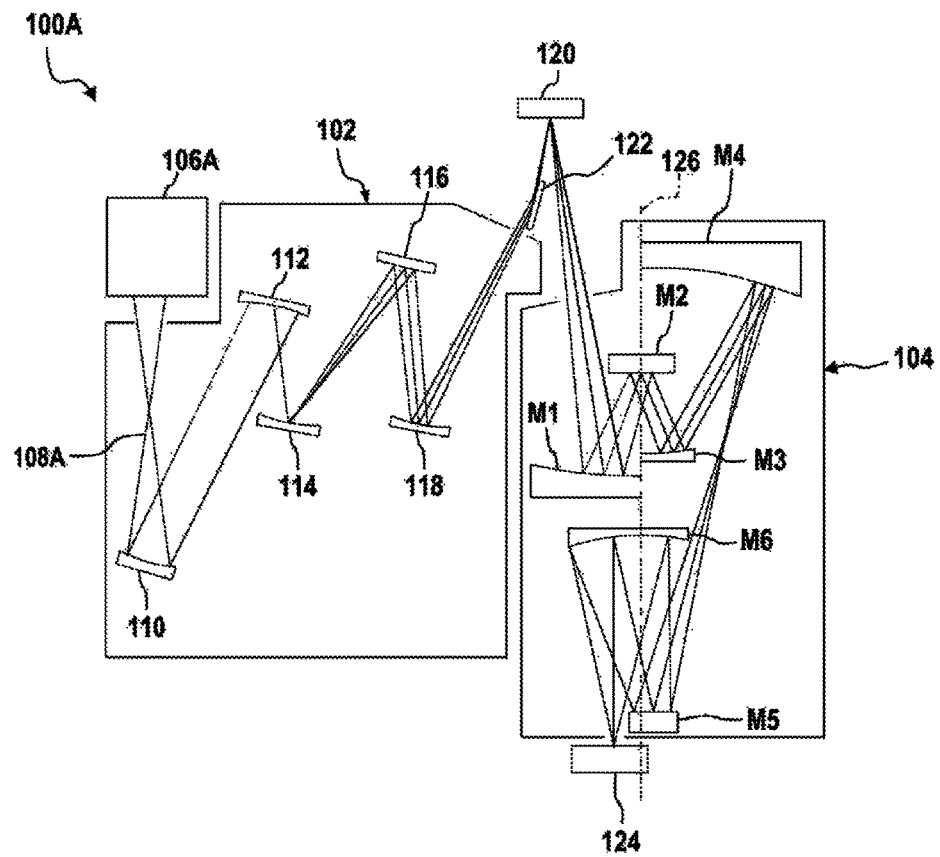
FIG. 1A shows a schematic view of an EUV lithography apparatus.

FIG. 1A shows a schematic view of an EUV lithography apparatus 100A, which includes a beam shaping and illumination system 102 and a projection system 104. EUV stands for "extreme ultraviolet" and refers to a wavelength of the working light of between 0.1 and 30 nm. The beam shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which drive devices for mechanically moving or setting optical elements are provided. Moreover, electrical controllers and the like can also be provided in this machine room.

The EUV lithography apparatus 100A includes an EUV light source 106A. A plasma source or a synchrotron, which emits radiation 108A in the EUV range (extreme ultraviolet range), i.e., for example, in the wavelength range of 5 nm to 20 nm, can be provided, for example, as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 illustrated in FIG. 1A has five mirrors 110, 112, 114, 116, 118. After passing through the beam shaping and illumination system 102, the EUV radiation 108A is guided onto a photomask (called a reticle) 120. The photomask 120 is likewise formed as a reflective optical element and can be arranged outside the systems 102, 104. Furthermore, the EUV radiation 108A can be directed onto the photomask 120 via a mirror 122. The photomask 120 has a structure which is imaged onto a wafer 124 or the like in a reduced fashion via the projection system 104. The projection system 104 (also referred to as projection lens) has six mirrors M1 to M6 for imaging the photomask 120 onto the wafer 124. In this case, individual mirrors M1 to M6 of the projection system 104 can be arranged symmetrically in relation to an optical axis 126 of the projection system 104. It should be noted that the number of mirrors M1 to M6 of the EUV lithography apparatus 100A is not restricted to the number represented. A greater or lesser number of mirrors M1 to M6 can also be provided. Furthermore, the mirrors M1 to M6 are generally curved on their front face for beam shaping.

Figure 1B:
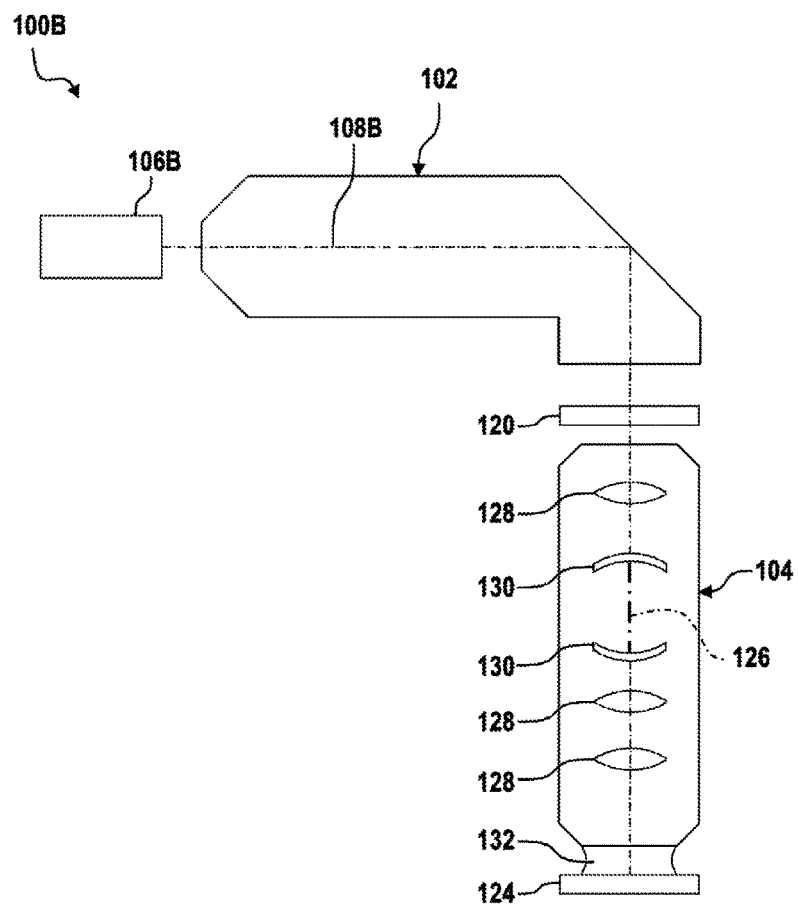
FIG. 1B shows a schematic view of a DUV lithography apparatus.

FIG. 1B shows a schematic view of a DUV lithography apparatus 100B, which includes a beam shaping and illumination system 102 and a projection system 104. DUV stands for "deep ultraviolet" and refers to a wavelength of the working light of between 30 and 250 nm. As has already been described with reference to FIG. 1A, the beam shaping and illumination system 102 and the projection system 104 can be arranged in a vacuum housing and/or surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1B guides the DUV radiation 108B onto a photomask 120. The reticle 120 is embodied as a transmissive optical element and can be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to an optical axis 126 of the projection system 104. It should be noted that the number of lens elements 128 and mirrors 130 of the DUV lithography apparatus 100B is not restricted to the number represented. A greater or lesser number of lens elements 128 and/or mirrors 130 can also be provided. Furthermore, the mirrors 130 are generally curved on their front face for beam shaping.

An air gap between a last lens element 128 and the wafer 124 can be replaced by a liquid medium 132 which has a refractive index of greater than 1. The liquid medium 132 can be high-purity water, for example. Such a construction is also referred to as immersion lithography and has an increased photolithographic resolution. The liquid medium 132 can also be referred to as an immersion medium or immersion liquid.

Figure 2:
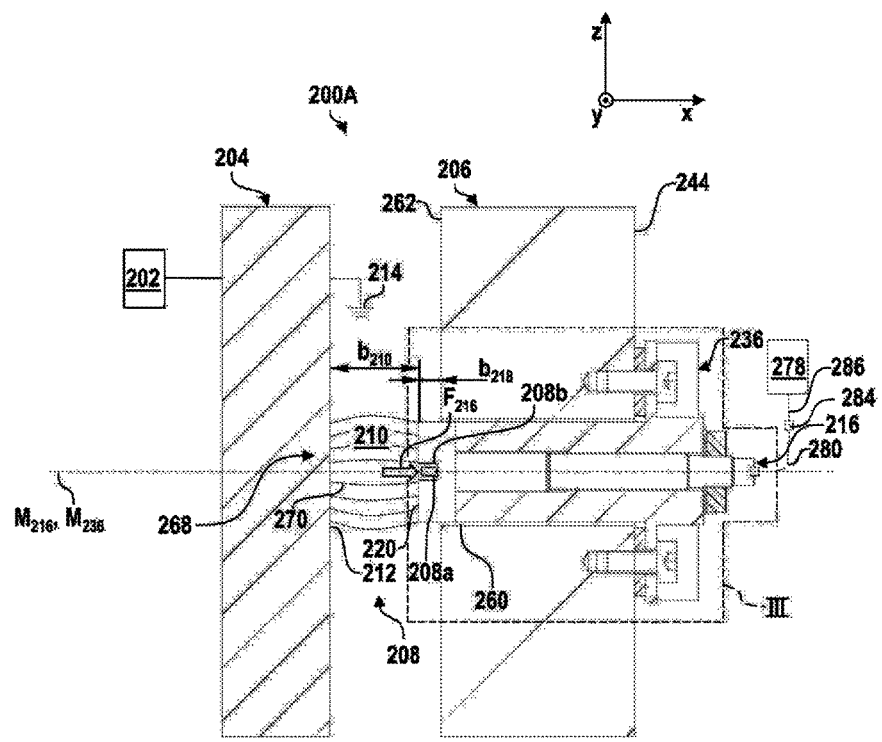
FIG. 2 shows a schematic sectional view of one embodiment of an optical device for the lithography apparatus in accordance with FIG. 1A or FIG. 1B.
Figure 3:
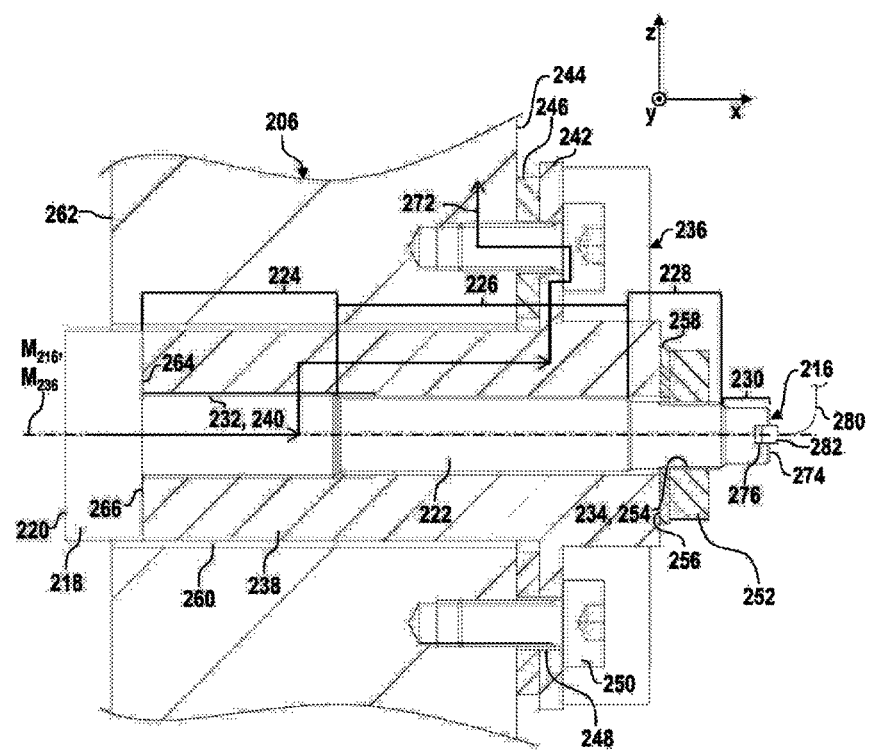
FIG. 3 shows an enlarged detail view III in accordance with FIG. 2.

FIG. 2 shows, in a greatly simplified schematic sectional view, an optical device 200A for a respective lithography apparatus 100A, 100B in accordance with FIGS. 1A and 1B. FIG. 3 shows a detail view III in accordance with FIG. 2. Reference is made below to FIGS. 2 and 3 simultaneously.

The optical device 200A can be a projection system 104 in accordance with FIGS. 1A and 1B. The optical device 200A includes an optical element 202. The optical element 202 can be one of the mirrors M1 to M6 or 130 or one of the lens elements 128 which have been described in association with FIGS. 1A and 1B. Alternatively, the optical element 202 can also be an optical grating or a λ plate. The optical device 200A can include a multiplicity of such optical elements 202.

The optical device 200A includes a force frame or supporting frame 204, to which the optical element 202 is coupled. Weight force compensation units on the basis of permanent magnets can be used for mounting the optical element 202 on the supporting frame 204. The compensation force generated by such a weight force compensation unit acts counter to the weight force of the optical element 202, and corresponds substantially to it in terms of its absolute value. By contrast, a movement of optical element 202—in particular also in the vertical direction—can be actively controlled by way of so-called Lorentz actuators. Such a Lorentz actuator respectively includes an energizable coil and, at a distance from it, a permanent magnet. These together generate an adjustable magnetic force for controlling the movement of the optical element 202.

That is to say that the optical element 202 is manipulable, in particular adjustable and/or deformable, for positioning or position correction of same. One or more actuators, in particular Lorentz actuators, can be provided for this purpose. The supporting frame 204 can support a multiplicity of optical elements 202 of this type. The supporting frame 204 can be produced from a ceramic material. By way of example, the supporting frame 204 can be produced from a non-oxide ceramic, for example a silicon carbide (SiC/SiSiC). Alternatively, the supporting frame 204 can also be produced from a different material, such as steel, for example. Preferably, the supporting frame 204 is produced from an electrically conductive material.

The optical device 200A furthermore includes a sensor frame 206, which is mechanically decoupled from the supporting frame 204. The sensor frame 206 can likewise be produced from a ceramic material, such as silicon carbide, or from a steel material. A multiplicity of sensors can be provided on the sensor frame 206, sand sensors being configured to detect the positioning of the optical element 202 or of the optical elements 202. With the aid of the position of the optical element 202 that is determined by the sensors, the alignment of the optical element can be corrected with the aid of the actuators provided on the supporting frame 204.

A mechanical decoupling of the supporting frame 204 from the sensor frame 206 should be understood to mean that no or at least negligible oscillations, forces and/or vibrations are transmitted from the supporting frame 204 to the sensor frame 206, and vice versa. This can be achieved by the sensor frame 206 being mounted with the aid of a soft mounting or actuator system. By way of example, the sensor frame 206 can be mounted with the aid of very soft spring elements.

The optical device 200A furthermore includes a sensor arrangement 208 configured to determine a width $b_{210}$ of a gap 210 between the supporting frame 204 and the sensor frame 206. The width $b_{210}$ is preferably 100 to 300 μm. The sensor arrangement 208 is configured to determine the width $b_{210}$ capacitively. That is to say that the sensor arrangement 208 forms a capacitive sensor. A capacitive sensor operates on the basis of a change in the capacitance of an individual capacitor or of an entire capacitor system.

The sensor arrangement 208 includes a contact surface 212 provided at the supporting frame 204. The contact surface 212 can be an end side of the supporting frame 204 facing the sensor frame 206. The contact surface 212 is grounded. For this purpose, the contact surface 212 is electrically conductively connected to a grounding arrangement 214. The grounding arrangement 214 constitutes an electrically conductive connection of the supporting frame 204 to a housing foundation and/or to earth.

The sensor arrangement 208 includes a contact element 216 besides the contact surface 212. The contact element 216 is provided on the sensor frame 206. However, the contact element 216 can also be provided on the supporting frame 204, and the contact surface 212 can correspondingly be provided on the sensor frame 206. However, it is assumed hereinafter that the contact element 216 is arranged on the sensor frame 206. The contact element 216 can also be referred to as an end stop.

The contact element 216 includes a cylindrical contact section 218 having an end side 220. The contact section 218 can have a circular cross section. The end side 220 can be planar. The width $b_{210}$ is defined as the distance between the contact surface 212 and the end side 220 of the contact element 216. The contact element 216 includes, besides the contact section 218, a multistage shaft section 222 formed integrally with the contact section 218. The shaft section 222 and the contact section 218 are preferably formed rotationally symmetrically with respect to an axis of symmetry or center axis $M_{216}$ of the contact element 216.

The contact element 216 and at least the contact section 218 are produced from an aluminum-bronze alloy. This results in a high compressive strength and abrasion resistance. This reliably prevents metallic abrasion from arising upon contact between the contact section 218 and the contact surface 212. The shaft section 222 has four stepped portions 224, 226, 228, 230. In particular, the shaft section 222 has a first stepped portion 224, a second stepped portion 226, a third stepped portion 228 and a fourth stepped portion 230. An external diameter of the contact section 218 is greater than an external diameter of the first stepped portion 224, the external diameter of which is in turn greater than an external diameter of the second stepped portion 226, the external diameter of which is in turn greater than an external diameter of the third stepped portion 228, the diameter of which is in turn greater than an external diameter of the fourth stepped portion 230.

An external thread 232 is provided on the first stepped portion 224. The external thread 232 is preferably a fine thread. A fine thread has a narrower thread profile in comparison with a coarse-pitch thread. The external thread 232 can be an M12×0.5 thread, for example. Adjacent to the first stepped portion 224 is the second stepped portion 226, which has no external thread and is thus smooth on the outer side. An external thread 234 is once again provided on the third stepped portion 228. The external thread 234 can be an M10×1.5 thread. The fourth stepped portion 230 is once again smooth-walled on the outer side, that is to say that it has no thread.

The optical device 200A includes a receptacle element 236 for receiving the contact element 216, the receptacle element being fitted to the supporting frame 204 or to the sensor frame 206. As shown in FIGS. 2 and 3, the receptacle element 236 can be provided on the sensor frame 206. The receptacle element 236 includes a tubular or sleeve-shaped base section 238, which receives the shaft section 222 of the contact element 216. The receptacle element 236 can be produced from a steel material. An internal diameter of the base section 238 is at least slightly greater than the external diameter of the second stepped portion 226 of the shaft section 222 of the contact element 216. The receptacle element 236 is electrically insulated from the sensor frame 206.

An internal thread 240 corresponding to the external thread 232 of the shaft section 222 of the contact element 216 can be provided on the inner side of the base section 238. The external thread 232 and the internal thread 240 are optional. With the aid of the external thread 232 and the internal thread 240, the contact element 216 can be displaced relative to the receptacle element 236 along a center axis $M_{236}$ thereof. In this case, the center axis $M_{236}$ is arranged coaxially with the center axis $M_{216}$. Furthermore, as an alternative to the external thread 232 and the corresponding internal thread 240, provision can be made of some other facility, for example a piezoactuator, for displacing the contact element 216 relative to the receptacle element 236.

The receptacle element 236 furthermore has a flange section 242 formed integrally with the base section 238. The flange section 242 is in the form of a sheet and extends around the base section 238. An electrically insulating ceramic sheet 246 is positioned between the flange section 242 and an end side 244 of the sensor frame 206. The flange section 242 preferably has a multiplicity of holes 248 through which are led fixing screws 250 for fixing the receptacle element 236 to the sensor frame 206. The holes 248 can be arranged in a manner distributed uniformly over a circumference of the flange section 242. The fixing screws 250 can be for example fillister-head screws having an M6×1.0 thread. The fixing screws 250 are electrically insulated from the flange section 242, such that the receptacle element 236 and thus also the contact element 216 are not electrically conductively connected to the sensor frame 206.

The contact element 216 is braced with the receptacle element 236 with the aid of a securing nut 252. The securing nut 252 has an internal thread 254, which engages in a positively locking manner into the external thread 234 of the shaft section 222 of the contact element 216. A washer 258 is arranged between the securing nut 252 and an end side 256 of the base section 238. The washer 258 can be a steel disk.

Circumferentially around the base section 238 and between the latter and the sensor frame 206 a gap 260 is provided in order to electrically insulate the receptacle element 236 and thus also the contact element 216 from the sensor frame 206, as already mentioned above. The contact section 218 of the contact element 216 is arranged partly within the sensor frame 206, but is electrically insulated from the latter with the aid of the gap 260. The gap 260 can have a width of 50 μm.

The contact section 218 projects beyond the sensor frame 206 with a distance $b_{218}$ by way of an end side 262 of the sensor frame facing the supporting frame 204. The distance $b_{218}$ is adjustable. The distance $b_{218}$ can be set by the securing nut 252 firstly being loosened or removed. Afterward, the contact element 216 can be rotated, as a result of which, depending on the direction of rotation, with the aid of the external thread 232 of the contact element 216 and the internal thread 240 of the receptacle element 236, the distance $b_{218}$ can be increased and the width $b_{210}$ of the gap can thus be decreased, or the distance $b_{218}$ can be decreased and the width $b_{210}$ of the gap 210 can thus be increased. Once the desired distance $b_{218}$ or the desired width $b_{210}$ has been set, the securing nut 252 is tightened again in order to fix the contact element 216 in the desired position. In an end position, in which a minimum distance $b_{218}$ or a maximum width $b_{210}$ of the gap 210 is set, an end side 264 of the contact section 218 of the contact element 216 bears against an end side 266 of the base section 238 of the receptacle element 236.

The contact element 216 and in particular the contact section 218 can contact the contact surface 212 in order to limit a relative movement of the supporting frame 204 relative to the sensor frame 206. That is to say that the contact element 216 can strike the contact surface 212. A contact between the contact element 216 and the contact surface 212 can occur for example in the event of severe oscillations, vibrations or tilting of the optical device 200A. This can occur for example during transport of the optical device 200A. By virtue of the fact that a defined stop is realized with the aid of the contact element 216 and the contact surface 212, damage to the optical device 200A can be prevented. The use of an aluminum-bronze alloy for the contact element 216 furthermore reliably prevents metallic abrasion from arising when the contact element 216 contacts the contact surface 212.

The contact element 216 can also be used for transport securing of the optical device 200A. In particular, as described above, the contact element 216 can be displaced in relation to the receptacle element 236 or in relation to the sensor frame 206 or, for the case where the contact element 216 is provided on the supporting frame 204, in relation to the supporting frame 204, in order to brace the supporting frame 204 with the sensor frame 206. For this purpose, the contact element 216 is displaced in relation to the receptacle element 236 until this bears against the contact surface 212.

The contact element 216 and the contact surface 212 jointly form an electrical capacitor 268, in particular a plate capacitor, of the sensor arrangement 208. The contact surface 212 and the contact element 216 form the electrical capacitor 268, wherein the capacitance of the capacitor 268 is determined by the width $b_{210}$ of the gap. In particular, the contact element 216, to put it more precisely the end side 220, and the contact surface 212 form two plates of a plate capacitor, which are arranged opposite one another. In the event of the end side 220 and the contact surface 212 moving toward one another or moving away from one another, the width $b_{210}$ and thus the electrically measurable capacitance of the capacitor 268 change. An alteration of the width $b_{210}$ of the gap 210 can be determined by way of the change in the capacitance. For measuring the width $b_{210}$, a characteristic curve of the capacitor 268 is linearized in analog or digital fashion. An electric field forms between the contact element 216 and the contact surface 212, the field lines 270 of the electric field being illustrated schematically. The field lines 270 are curved.

Instead of the above-described capacitive measurement of the width $b_{210}$ of the gap 210, an inductive or optical measurement can also be carried out:

By way of example, for an inductive measurement provision could be made for the movement of the contact element 216 relative to the contact surface 212 to lead to the induction of an eddy current in the contact element 216. The eddy current is detected. The width $b_{210}$ of the gap 210 is determined on the basis of the detected eddy current.

Furthermore, for an optical measurement, for example, a confocal or some other optical sensor 208*a* could be arranged in an opening 208*b* of the contact element 216 (in particular in the form of a hole), as indicated schematically in FIG. 2. A corresponding optical measurement beam could be generated or reflected back at the contact surface 212.

A force $F_{216}$ introduced into the contact element 216 upon contact between the contact element 216 and the contact surface 212 is introduced into the sensor frame 206 via the contact element 216, the receptacle element 236 and the fixing screws 250. The introduction of force is illustrated with the aid of an arrow 272 in FIG. 3.

An electrical connector 276 for electrically connecting the contact element 216 to an evaluation unit 278 is provided on the contact element 216, for example on a rear-side end side 274 thereof facing away from the end side 220. The evaluation unit 278 is configured to evaluate signals of the capacitor 268 and to output the present width $b_{210}$. The optical device 200A can include the evaluation unit 278. The evaluation unit 278 has a connecting line or a cable 280, at the end of which is provided a plug 282 for electrical connection to the connector 276. By way of example, if the contact element 216 is difficult to access, the cable 280 can remain at the contact element 216 or at the sensor frame 206. For this purpose, a disconnectable connector 284 can be provided on the cable 280, the connector being connected to the evaluation unit 278 via a further cable 286.

With the aid of the sensor arrangement 208, before the optical device 200A is started up, it is thus possible for the width $b_{210}$ to be checked and, if appropriate, as described above, set with the aid of the contact element 216 being displaced with respect to the receptacle element 236. Preferably, the width $b_{210}$ after the setting thereof is 100 to 300 µm. As a result, it is possible to reliably prevent a mechanical short circuit between the supporting frame 204 and the sensor frame 206, that is to say a touching contact between the contact surface 212 and the contact element 216 during operation of the optical device 200A. Manual measurement of the width $b_{210}$, for example with the aid of a feeler gauge, can be dispensed with. The width $b_{210}$ can be determined reliably and simply even if the gap 210 is not accessible and not visible. Furthermore, a reliable transport securing of the optical device 200A can be achieved with the aid of the contact element 216.

Figure 4:
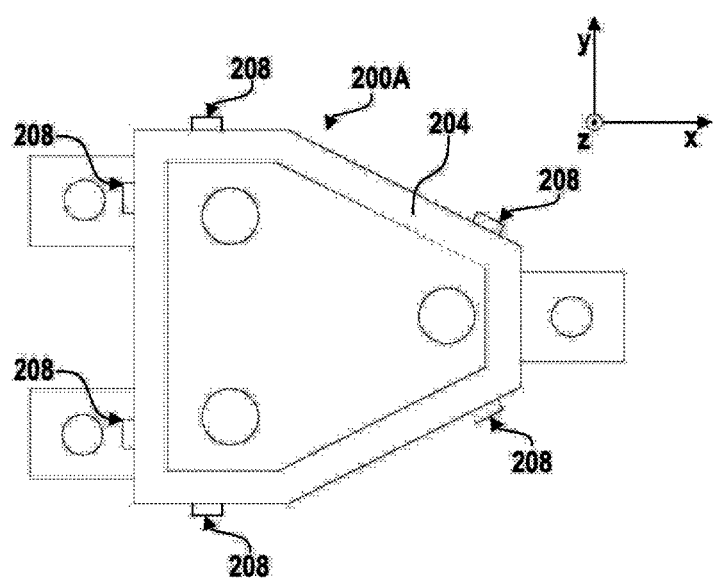
FIG. 4 shows a schematic plan view of the optical device in accordance with FIGS. 2 and 3.

FIG. 4 shows a greatly simplified schematic plan view of the optical device 200A. A multiplicity of such sensor arrangements 208 can be provided on the optical device 200A. The sensor frame 206 is not shown in FIG. 4. FIGS. 2 to 4 furthermore each show a coordinate system having an x-axis x, a y-axis y and a z-axis z. With the aid of the contact elements 216 of the sensor arrangements 208, it is possible to achieve a fixing of the supporting frame 204 to the sensor frame 206, or vice versa, in a plane spanned by the x-axis x and the y-axis y.

Figure 5:
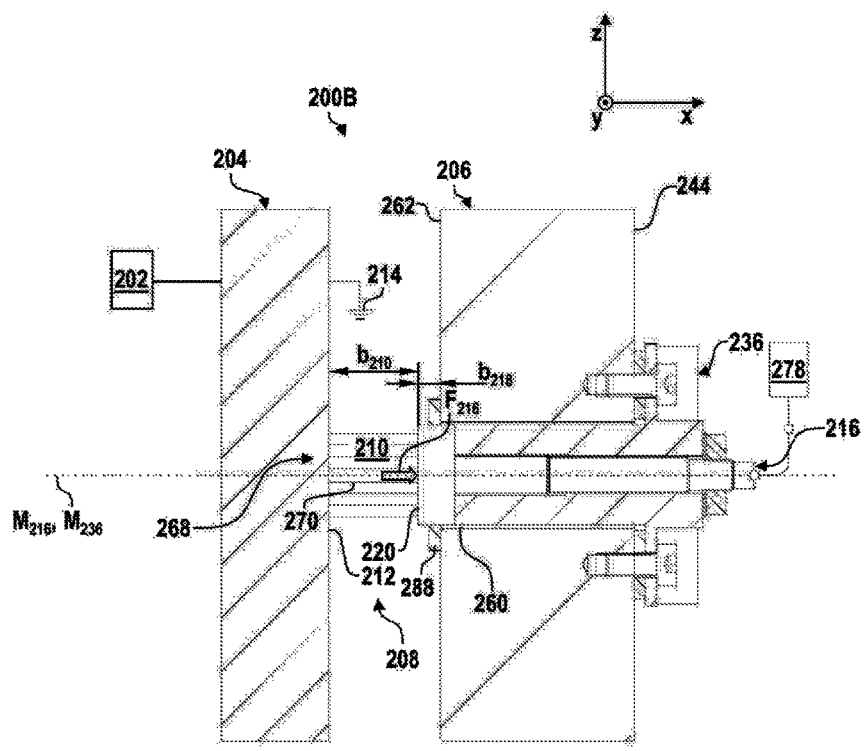
FIG. 5 shows a sectional view of a further embodiment of an optical device for the lithography apparatus in accordance with FIG. 1A or FIG. 1B.

FIG. 5 shows a further embodiment of an optical device 200B. The optical device 200B in accordance with FIG. 5 differs from the optical device 200A in accordance with FIGS. 2 to 4 merely in that a guard ring or guard ring capacitor 288 for field shielding is provided on the contact element 216 and in particular on the contact section 218 of the contact element 216.

The guard ring capacitor 288 extends around the contact section 218 in a ring-shaped manner. With the aid of the guard ring capacitor 288, as shown schematically in FIG. 5, the electric field can be shielded, such that the field lines 270 are positioned substantially perpendicular to the end side 220 of the contact section 218 of the contact element 216. The measurement accuracy can be significantly improved as a result. In particular, the width $b_{210}$ of the gap can be set to an accuracy of 10 µm as a result. The functionality of the optical device 200B otherwise corresponds to the functionality of the optical device 200A.

Figure 6:
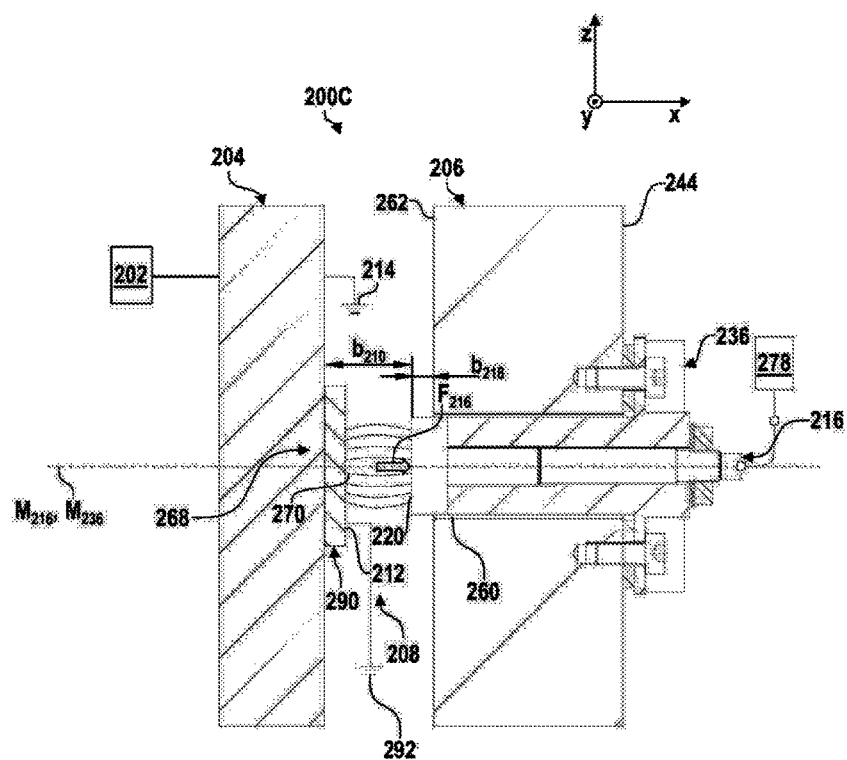
FIG. 6 shows a sectional view of a further embodiment of an optical device for the lithography apparatus in accordance with FIG. 1A or FIG. 1B.

FIG. 6 shows a further embodiment of an optical device 200C. The optical device 200C in accordance with FIG. 6 differs from the device 200A in accordance with FIGS. 2 to 4 merely in that the optical device 200C includes a mating contact element 290 corresponding to the contact element 216, the mating contact element having the contact surface 212. The mating contact element 290 can be screwed, adhesively bonded or riveted to the supporting frame 204, for example. The mating contact element 290 is produced from a metallic material. The mating contact element 290 can be produced from a titanium-aluminum alloy, in particular. The mating contact element 290 is in the form of a plate. The mating contact element 290 can be circular.

Either the mating contact element 290 is electrically conductively connected to the supporting frame 204 and thus grounded via the grounding arrangement 214, or the mating contact element 290 is electrically insulated from the supporting frame 204 and has a dedicated grounding arrangement 292. The optical device 200C can furthermore include the guard ring capacitor 288 for field shielding as shown in FIG. 5. The functionality of the optical device 200C otherwise corresponds to the functionality of the optical device 200A.

Figure 7:
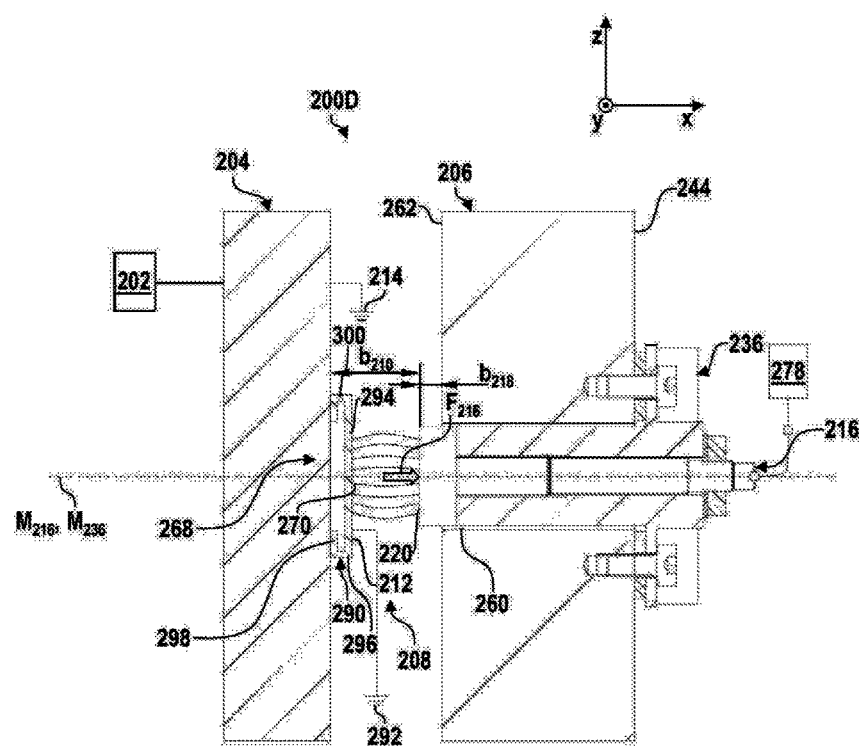
FIG. 7 shows a sectional view of a further embodiment of an optical device for the lithography apparatus in accordance with FIG. 1A or FIG. 1B.

FIG. 7 shows a further embodiment of an optical device 200D. The optical device 200D in accordance with FIG. 7 differs from the optical device 200C in accordance with FIG. 6 merely in an alternative configuration of the mating contact element 290. In the case of the embodiment of the optical device 200D in accordance with FIG. 7, the mating contact element 290 is not embodied as a solid plate, but rather includes a spring section 294 configured to deform spring-elastically upon contact with the contact element 216. The spring section 294 is a leaf spring, in particular.

The mating contact element 290 is pot-shaped and includes, besides the spring section 294, a tubular base section 296, which is closed off at the end side by the spring section 294 in the direction of the sensor frame 206. Situated opposite the spring section 294, a ring-shaped circumferential fixing section 298 is provided, which is fixedly connected to the supporting frame 204. At least one or a plurality of holes 300 perforating the base section 296 can be provided at the latter. With the aid of the hole 300 or the holes 300, an interior 302 of the mating contact element 290 can be ventilated during evacuation of the optical device 200D. An undesired deformation of the mating contact element 290 is prevented as a result. The optical device 200D can include the guard ring capacitor 288 for field shielding as shown in FIG. 5. The functionality of the optical device 200D otherwise corresponds to the functionality of the optical device 200A.

Figure 8:
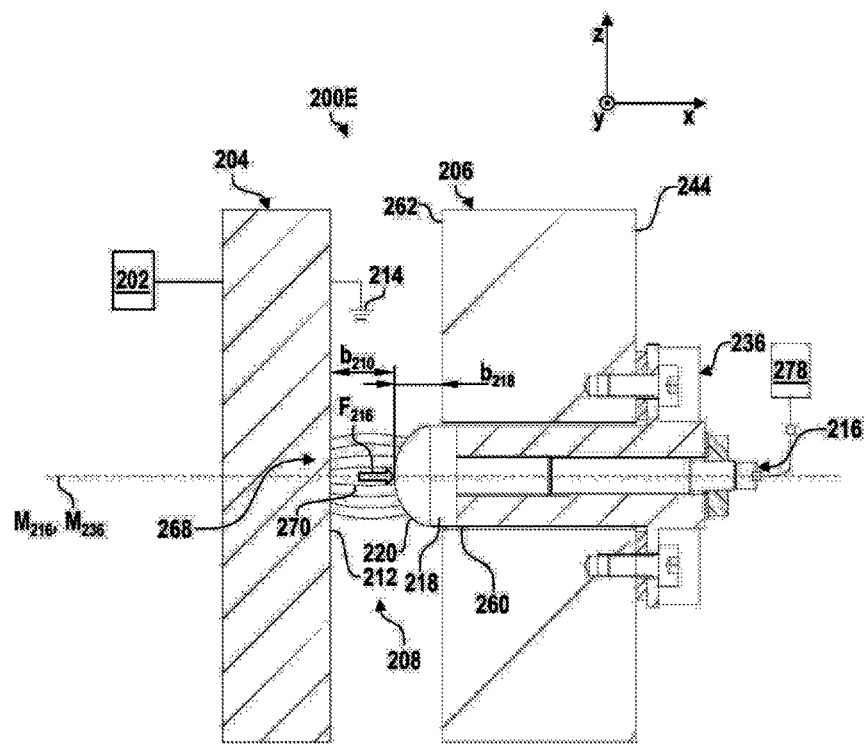
FIG. 8 shows a sectional view of a further embodiment of an optical device for the lithography apparatus in accordance with FIG. 1A or FIG. 1B.

FIG. 8 shows a further embodiment of an optical device 200E. The optical device 200E differs from the optical device 200A in accordance with FIGS. 2 to 4 merely in that the contact section 218 of the contact element 216 is not planar but rather curved, in particular spherically, on the front side. That is to say that the end side 220 is spherical or in the shape of a spherical cap. A punctiform contact between the end side 220 and the contact surface 212 can be achieved as a result. The width $b_{210}$ of the gap 210 is then defined as a distance between the contact surface 212 and a foremost point of the end side 220 situated closest to the contact surface 212.

The optical device 200E in accordance with FIG. 8 can include the guard ring capacitor 288 for field shielding as shown in FIG. 5, the mating contact element 290 shown in FIG. 6, or the mating contact element 290 shown in FIG. 7. The functionality of the optical device 200E otherwise corresponds to the functionality of the optical device 200A.

Although the disclosure has been described here on the basis of preferred exemplary embodiments, it is not in any way restricted to them but rather can be modified in a wide variety of ways.

LIST OF REFERENCE SIGNS

100A EUV lithography apparatus
100B DUV lithography apparatus
102 Beam shaping and illumination system
104 Projection system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 Optical axis
128 Lens element
130 Mirror
132 Medium
200A Optical device
200B Optical device
200C Optical device
200D Optical device
200E Optical device
202 Optical element
204 Supporting frame
206 Sensor frame
208 Sensor arrangement
208a Optical sensor
208b Opening
210 Gap
212 Contact surface
214 Grounding arrangement
216 Contact element
218 Contact section
220 End side
222 Shaft section
224 Stepped portion
226 Stepped portion
228 Stepped portion
230 Stepped portion
232 External thread
234 External thread
236 Receptacle element
238 Base section
240 Internal thread
242 Flange section
244 End side
246 Ceramic sheet
248 Hole
250 Fixing screw
252 Securing nut
254 Internal thread
256 End side
258 Washer
260 Gap
262 End side
264 End side
266 End side
268 Capacitor
270 Field line
272 Arrow
274 End side
276 Connector
278 Evaluation unit
280 Cable
282 Plug
284 Connector
286 Cable
288 Guard ring capacitor
290 Mating contact element
292 Grounding arrangement
294 Spring section
296 Base section
298 Fixing section
300 Hole
302 Interior
$b_{210}$ Width
$b_{218}$ Distance
$F_{216}$ Force
M1 Mirror
M2 Mirror
M3 Mirror
M4 Mirror
M5 Mirror
M6 Mirror
$M_{216}$ Center axis
$M_{236}$ Center axis

What is claimed is:

1. An optical device, comprising:
an optical element;
a supporting frame supporting the optical element;
a sensor frame mechanically decoupled from the supporting frame, a gap being present between the supporting frame and the sensor frame; and
a sensor arrangement configured to determine a width of the gap in a non-contact manner,
wherein:
the sensor arrangement comprises a contact element and a contact surface; and
the contact element is configured to contact the contact surface to limit a relative movement of the supporting frame relative to the sensor frame.

2. The optical device of claim 1, wherein the contact element is displaceable in relation to the sensor frame to brace the supporting frame with the sensor frame.

3. The optical device of claim 1, wherein the contact element is displaceable in relation to the supporting frame to brace the supporting frame with the sensor frame.

4. The optical device of claim 1, further comprising a receptacle element fitted to the sensor frame, wherein the contact element is received in the receptacle element.

5. The optical device of claim 1, further comprising a receptacle element fitted to the supporting frame, wherein the contact element is received in the receptacle element.

6. The optical device of claim 5, wherein:
a gap is present between the receptacle element and the sensor frame;
the gap is circumferentially around the receptacle element; and
the gap is configured to electrically insulate the receptacle element and the contact element from the sensor frame.

7. The optical device of claim 5, wherein:
a gap is present between the receptacle element and the supporting frame;
the gap is circumferentially around the receptacle element; and
the gap is configured to electrically insulate the receptacle element and the contact element from the supporting frame.

8. The optical device of claim 5, wherein the contact element is displaceable relative to the receptacle element along a center axis of the receptacle element.

9. The optical device of claim 1, further comprising a mating contact element having the contact surface.

10. The optical device of claim 9, wherein the mating contact element is electrically conductively connected to the sensor frame or the supporting frame.

11. The optical device of claim 9, wherein the mating contact element comprises a spring section configured to deform spring-elastically upon contact with the contact element.

12. The optical device of claim 1, wherein the supporting frame comprises the contact element, and the sensor frame comprises the contact surface.

13. The optical device of claim 1, wherein the supporting frame comprises the contact surface, and the sensor frame comprises the contact element.

14. The optical device of claim 1, wherein the sensor arrangement is configured to determine a width of the gap capacitively, optically or inductively.

15. The optical device of claim 1, wherein the contact element and the contact surface jointly define a capacitor of the sensor arrangement to capacitively determine the width of the gap.

16. The optical device of claim 1, wherein the sensor arrangement comprises a guard ring capacitor to field shield, and the guard ring capacitor is disposed at the contact element.

17. The optical device of claim 1, wherein the sensor arrangement comprises a confocal sensor to optically determine the width of the gap.

18. The optical device of claim 17, wherein at least a portion of the confocal sensor is in an opening in the contact element.

19. The optical device of claim 1, wherein the optical device is configured so that, during use of the optical device, an eddy current for inductively determining the width of the gap is generatable in the contact element and/or in the contact surface.

20. An apparatus, comprising:
the optical device of claim 1,
wherein the apparatus is a lithography apparatus.

* * * * *

UNITED STATES PATENT AND TRADEMARK OFFICE
CERTIFICATE OF CORRECTION

PATENT NO. : 10,168,619 B1
APPLICATION NO. : 16/124738
DATED : January 1, 2019
INVENTOR(S) : Ralf Zweering It is certified that error appears in the above-identified patent and that said Letters Patent is hereby corrected as shown below:

In the Specification

Column 11, Line 33, delete "piezeoactuator," and insert -- piezoactuator, --.

Signed and Sealed this
Sixteenth Day of April, 2019

Andrei Iancu
*Director of the United States Patent and Trademark Office*